(12) United States Patent
Park et al.

(10) Patent No.: US 8,587,048 B2
(45) Date of Patent: Nov. 19, 2013

(54) CAPACITOR FOR SEMICONDUCTOR DEVICE AND MANUFACTURING METHOD OF CAPACITOR FOR SEMICONDUCTOR DEVICE

(75) Inventors: Dong Hoon Park, Gyeonggi-do (KR); Jin Hyo Jung, Gyeonggi-do (KR); Min Kyung Ko, Gyeonggi-do (KR)

(73) Assignee: Dongbu Hitek Co., Ltd., Seoul (KR)

( * ) Notice: Subject to any disclaimer, the term of this patent is extended or adjusted under 35 U.S.C. 154(b) by 355 days.

(21) Appl. No.: 12/965,261

(22) Filed: Dec. 10, 2010

(65) Prior Publication Data

US 2011/0140186 A1 Jun. 16, 2011

(30) Foreign Application Priority Data

Dec. 11, 2009 (KR) ........................ 10-2009-0122942

(51) Int. Cl.
*H01L 29/94* (2006.01)
(52) U.S. Cl.
USPC .................. 257/305; 257/301; 257/E29.346; 438/386

(58) Field of Classification Search
USPC .................. 257/301, 305, E21.008, E29.346; 438/386
See application file for complete search history.

(56) References Cited

U.S. PATENT DOCUMENTS

| | | | | |
|---|---|---|---|---|
| 5,258,332 A | * | 11/1993 | Horioka et al. | 438/389 |
| 6,087,214 A | * | 7/2000 | Cunningham | 438/244 |
| 6,544,837 B1 | * | 4/2003 | Divakauni et al. | 438/243 |
| 2001/0038551 A1 | * | 11/2001 | Forbes | 365/177 |
| 2004/0262660 A1 | * | 12/2004 | Huang | 257/301 |
| 2007/0096204 A1 | * | 5/2007 | Shiratake | 257/330 |
| 2012/0270380 A1 | * | 10/2012 | Eun | 438/435 |

* cited by examiner

*Primary Examiner* — James Mitchell
*Assistant Examiner* — Colleen E Snow
(74) *Attorney, Agent, or Firm* — Saliwanchik, Lloyd & Eisenschenk

(57) ABSTRACT

Disclosed are a capacitor for a semiconductor device and a manufacturing method thereof. The capacitor includes a second oxide layer filling a first trench in a semiconductor substrate; second and third trenches in an active region at opposing sides of the second oxide layer in the first trench; a third oxide layer on the semiconductor substrate and on inner surfaces of the second and third trenches; and a polysilicon layer on the third oxide layer to fill the second and third trenches.

16 Claims, 14 Drawing Sheets

CAPACITOR FOR SEMICONDUCTOR DEVICE AND MANUFACTURING METHOD OF CAPACITOR FOR SEMICONDUCTOR DEVICE

CROSS-REFERENCE TO RELATED APPLICATION

This application claims the benefit under 35 U.S.C. §119 of Korean Patent Application No. 10-2009-0122942, filed Dec. 11, 2009, which is hereby incorporated by reference in its entirety.

BACKGROUND

As the design rule for a semiconductor device, such as a DRAM (dynamic random access memory) has been gradually reduced, the circuit configuration in the peripheral region becomes more important.

In the case of circuits provided in the peripheral region, many capacitors, such as a pumping capacitor or a reservoir capacitor, are necessary for the purpose of charge pumping or voltage stabilization of a power line.

An embedded memory cell typically includes an access transistor and a capacitor.

The capacitor of a memory cell can have a MOS (metal oxide semiconductor) capacitor structure formed on a trench insulating region. In order to form the MOS capacitor structure, a planarization process is performed after filling a trench of a substrate with insulating material(s). The insulating material(s) filled in the trench is partially etched by using a photo mask, and then a polysilicon layer forming a capacitor field plate is formed on the substrate such that the trench having the partially etched insulating material(s) is filled with the polysilicon layer.

At this time, the insulating material remaining in the trench has the function of spacing a cell region such that charges at opposite sides of the trench can be isolated from each other, and the polysilicon layer formed over the whole area of the substrate and in the trench may enable the operation of the mass-storage capacitor.

However, when the insulating materials filled in the trench are etched to define the capacitor field plate, it is difficult to adjust the etching rate between the inside of the trench and the insulating layer formed on the substrate due to various process parameters. Also, there is a difference of the etching region for each unit cell, so the isolation characteristic is lowered and the capacitance is reduced.

In addition, even if the capacitor is formed with the above trench structure, there is limitation of utilizing trench surfaces that determine the capacitance of the capacitor, so a highly integrated mass-storage capacitor may not be obtained.

BRIEF SUMMARY

Embodiments of a capacitor for a semiconductor device and a manufacturing method of the capacitor for the semiconductor device are provided, capable of maximizing capacitance of the capacitor having a high integration degree by optimally utilizing a trench structure, avoiding unstable isolation between unit cells caused by process parameters, and ensuring stability in capacitance of the capacitor.

A capacitor for a semiconductor device in accordance with certain embodiments may include a second oxide layer filling a first trench in a semiconductor substrate; a second trench and third trench in an active region at opposing sides of the second oxide layer in the first trench; a third oxide layer on the semiconductor substrate as well as on inner surfaces of the second and third trenches; and a polysilicon layer on the third oxide layer and filling the second and third trenches.

In addition, a method of manufacturing a capacitor for a semiconductor device in accordance with certain embodiments may include the steps of forming a first trench in a semiconductor substrate and forming a second oxide layer in the first trench; forming a second trench and a third trench in an active region at opposing sides of the second oxide layer in the first trench; forming a third oxide layer on the semiconductor substrate as well as on inner surfaces of the second and third trenches; and forming a polysilicon layer on the third oxide layer such that the second and third trenches are filled with the polysilicon layer.

DETAILED DESCRIPTION

Hereinafter, certain embodiments of a capacitor for a semiconductor device and a manufacturing method of the capacitor for the semiconductor device will be described with reference to accompanying drawings.

In the description of embodiments, it will be understood that when a layer (or film) is referred to as being 'on' another layer or substrate, it can be directly on another layer or substrate, or intervening layers may also be present. Further, it will be understood that when a layer is referred to as being 'under' another layer, it can be directly under another layer, or one or more intervening layers may also be present. In addition, it will also be understood that when a layer is referred to as being 'between' two layers, it can be the only layer between the two layers, or one or more intervening layers may also be present.

Embodiment 1

Figure 1:
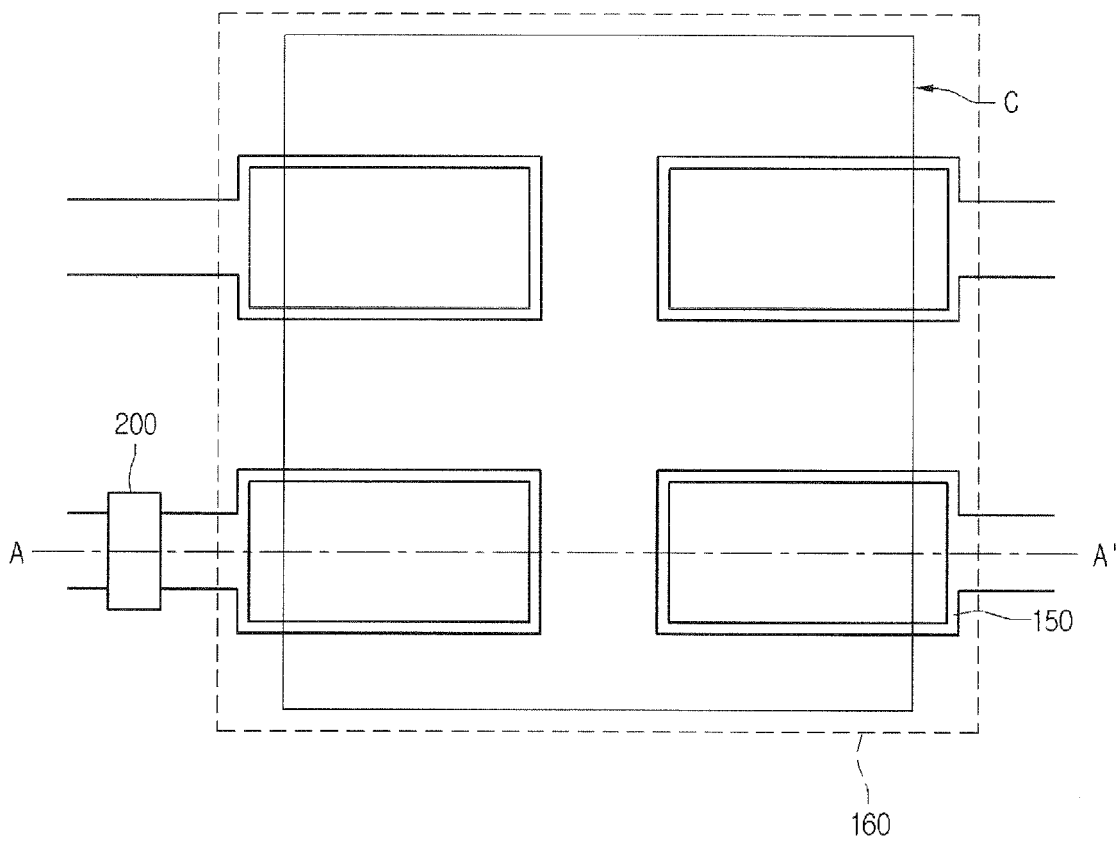
FIG. 1 is a plan view showing a capacitor for a semiconductor device according to a first embodiment.
Figure 2:
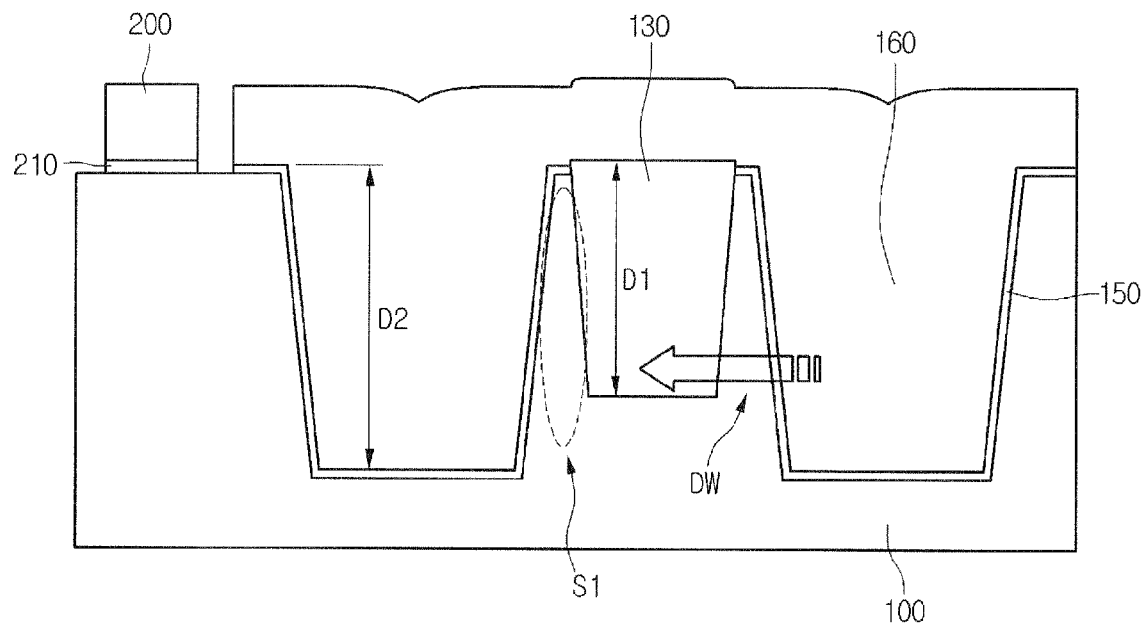
FIG. 2 is a cross-sectional view along line A-A' of FIG. 1 showing a capacitor for a semiconductor device according to the first embodiment.

FIG. 1 is a plan view showing a capacitor for a semiconductor device according to a first embodiment, and FIG. 2 is a cross-sectional view showing the capacitor for the semiconductor device according to the first embodiment.

For example, the capacitor for the semiconductor device according to this embodiment can be included in a memory cell of a semiconductor device, such as DRAM, but embodiments are not limited thereto.

FIGS. 3 to 10 are cross-sectional views along line A-A' of FIG. 1, showing a procedure for manufacturing the capacitor for the semiconductor device according to the first embodiment.

Referring to FIGS. 1 and 2, an active region of the capacitor for the semiconductor device extends beyond a capacitor region C, and a transistor 200 (which is generally referred to as a pass transistor) is formed on the active region extending beyond the capacitor region. The transistor 200 is omitted from FIGS. 3 to 9 for the purpose of convenience of explanation. The transistor 200 may be a transistor located in a logic region.

The capacitor for the semiconductor device according to an embodiment includes a second oxide layer 130 formed on a semiconductor substrate 100 in a first trench, a third oxide layer 150 formed on the semiconductor substrate 100 and in second and third trenches formed in the active region at opposing sides of the second oxide layer 130 in the first trench, and a first polysilicon layer 160 formed on the third oxide layer 150 such that the second and third trenches are filled with the first polysilicon layer 160.

The capacitor for the semiconductor device according to this embodiment has the following effects.

First, as shown in FIG. 2, the capacitor can have increased capacitance as compared to conventional capacitors because silicon S1 remains between the first polysilicon layer 160 in the second and third trenches and the second oxide layer 130 serving as an STI (shallow trench isolation) layer.

For instance, if depletion occurs and the second oxide layer 130 serving as the STI layer is subject to the depletion, the depletion width DW may be expanded corresponding to a horizontal width of the second oxide layer 130. That is, if the depletion occurs, the field region is subject to the depletion; so that the value of a sub-threshold slope (S) is reduced, thereby improving the switching characteristics.

In more detail, the sub-threshold slope (S) is a gate voltage required for increasing a drain current and is defined as following equation 1.

$$S = 2.3 V_{th} (1 + C_{dm}/C_{ox}),\quad \text{Equation 1}$$

where $V_{th}$ is the threshold voltage, $C_{dm}$ is the depletion layer capacitance, and $C_{ox}$ is the gate oxide capacitance.

Meanwhile, $C_{dm}$ is inversely proportional to the depletion width DW. Thus, if the depletion width DW is increased, $C_{dm}$ is reduced, so that the value of the sub-threshold slope (S) is reduced.

The value of the sub-threshold slope (S) is determined as about 60-100 mV/dec due to the MOS structure and the ideal value is 60 mV/dec.

As can be seen from equation 1, if $C_{dm}$ is reduced, the value of the sub-threshold slope (S) is also reduced.

If the value of the sub-threshold slope (S) is reduced, a smaller voltage is required in the standby state, so the leakage current is reduced. In addition, the transition may be instantly achieved from the on state to the off state, or vice versa.

Therefore, according to the present invention, since silicon S1 remains between the first polysilicon layer 160 and the second oxide layer 130, the depletion width DW may be expanded corresponding to the horizontal width of the second oxide layer 130. Thus, if the depletion occurs, the field region is subject to the depletion so that the value of the sub-threshold slope (S) is reduced, thereby improving the switching characteristics.

In addition, according to an embodiment, the second oxide layer may not serve as the capacitor area, but perform the isolation function for the capacitor, so additional etching and oxide layer deposition processes may not be necessary. Thus, the unstable isolation between unit cells derived from the process parameters can be inhibited from occurring, the stable capacitance can be achieved, and the degradation of the device can be minimized.

For instance, according to an embodiment, since the second oxide layer serving as the STI layer remains without being recessed, the second oxide layer can reliably perform the cell to cell isolation function.

According to an embodiment, the depth D1 of the second oxide layer 130 serving as the STI layer is at least ⅓ the depth D2 of the first polysilicon layer 160, but embodiments are not limited thereto.

Therefore, the second oxide layer 130 may serve as a hard mask when the trench etching process is performed while stably performing the cell to cell isolation.

In addition, according to an embodiment, the capacitance of the capacitor can be maximized while increasing the integration degree of the capacitor by employing the triple trench structure.

Further, according to an embodiment, the trenches, which determine the capacitance of the capacitor, can be isolated from each other by the partition wall structure of the semiconductor substrate, so the capacitor area can be maximized.

In addition, according to an embodiment, an ion implantation layer (not shown) is formed in the capacitor area, so that conductivity of the second and third trenches can be improved and the threshold voltage can be lowered.

In addition, according to an embodiment, the third oxide layer can be uniformly deposited on sidewalls and bottom walls of the second and third trenches by using an HTO layer (high temperature oxide layer, not shown) or an $N_2$ doping layer (not shown). Thus, stability of the capacitor characteristics can be further ensured.

Hereinafter, a method of manufacturing the capacitor for the semiconductor device according to the first embodiment will be described with reference to FIGS. 3 to 10.

Figure 3:
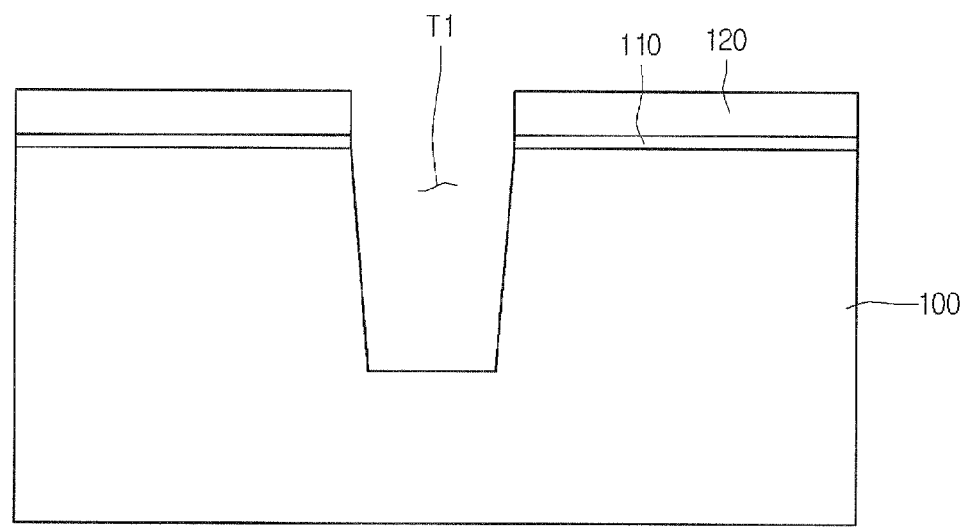
FIGS. 3 to 10 are cross-sectional views along line A-A' of FIG. 1 showing a procedure for manufacturing a capacitor for a semiconductor device according to the first embodiment.

Referring to FIG. 3, a first oxide layer 110 is formed on a semiconductor substrate 100, and a first nitride layer 120 is formed on the first oxide layer 110.

After the first nitride layer 120 has been formed, a photo process and an etching process can be preformed to form a first trench T1 by partially removing the first oxide layer 110, the first nitride layer 120 and the semiconductor substrate 100.

The semiconductor substrate 100 formed with the first trench T1 may be an N well type substrate or a P well type substrate.

Figure 4:
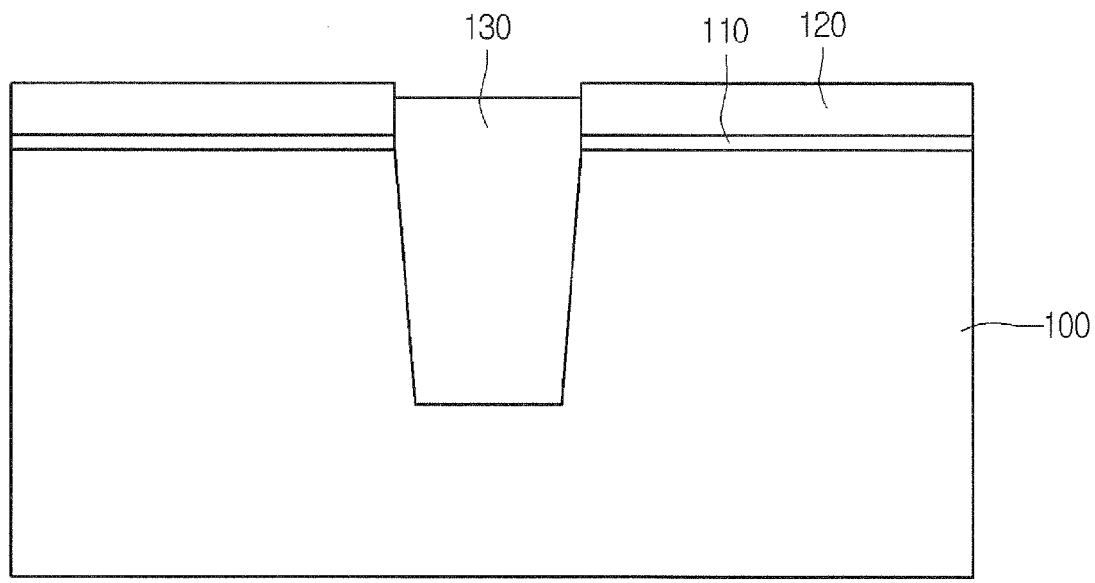

Then, referring to FIG. 4, a second oxide layer 130 is formed on the first nitride layer 120 such that the first trench T1 is filled with the second oxide layer 130. A CMS (chemical mechanical polishing) process or an etching process can be performed until the surface of the first nitride layer 120 is exposed, thereby planarizing the second oxide layer 130.

At this time, the first nitride layer 120 may serve as an etch stop layer.

Thus, the second oxide layer 130 is exclusively formed in the first trench T1. In addition, a step difference may slightly occur between the surface of the second oxide layer 130 and the first trench T1 due to the difference of the etching rate.

The first and second oxide layers 130 can include the same material, but embodiments are not limited thereto.

Figure 5:
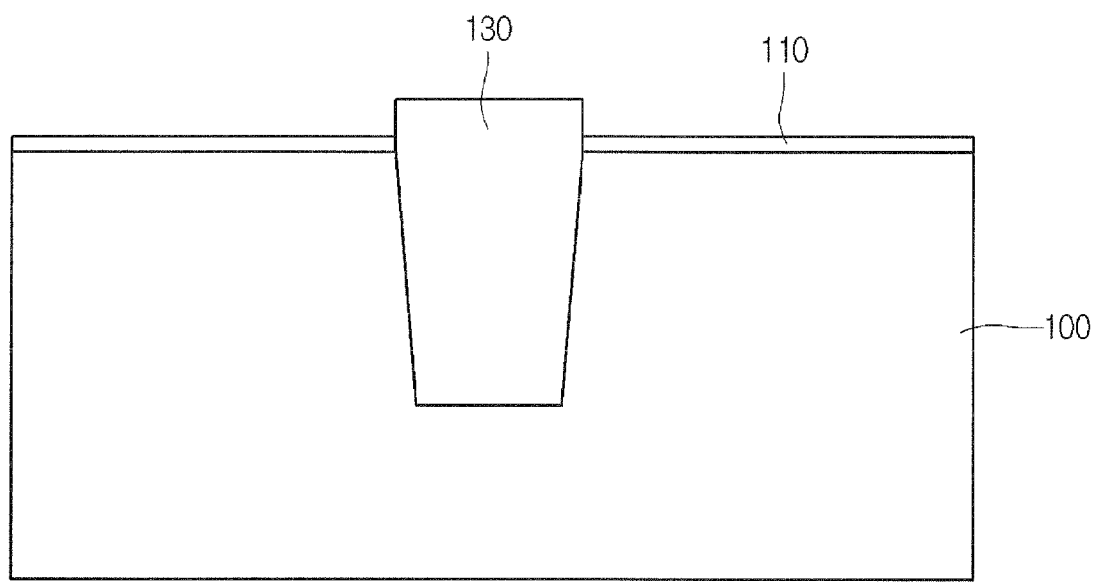
Figure 6:
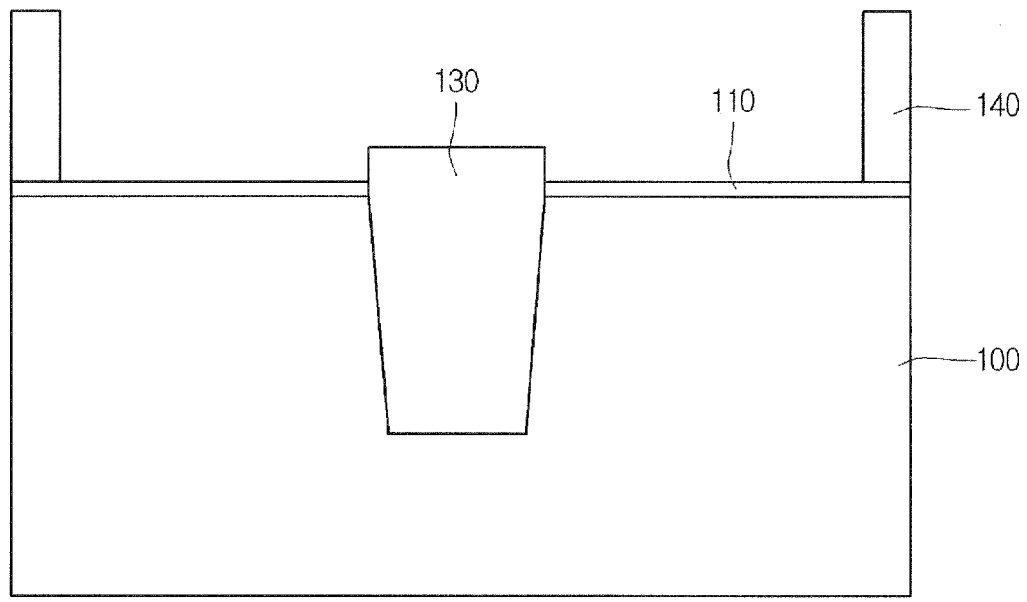

Then, referring to FIG. 5, a wet etching process is performed to remove the nitride layer 120. In addition, referring to FIG. 6, first photoresist patterns 140, which define a capacitor area of the memory cell, are formed on the semiconductor substrate 100.

The first photoresist patterns 140 are formed at opposing side ends of the second oxide layer 130 while being spaced apart from each other.

Figure 7:
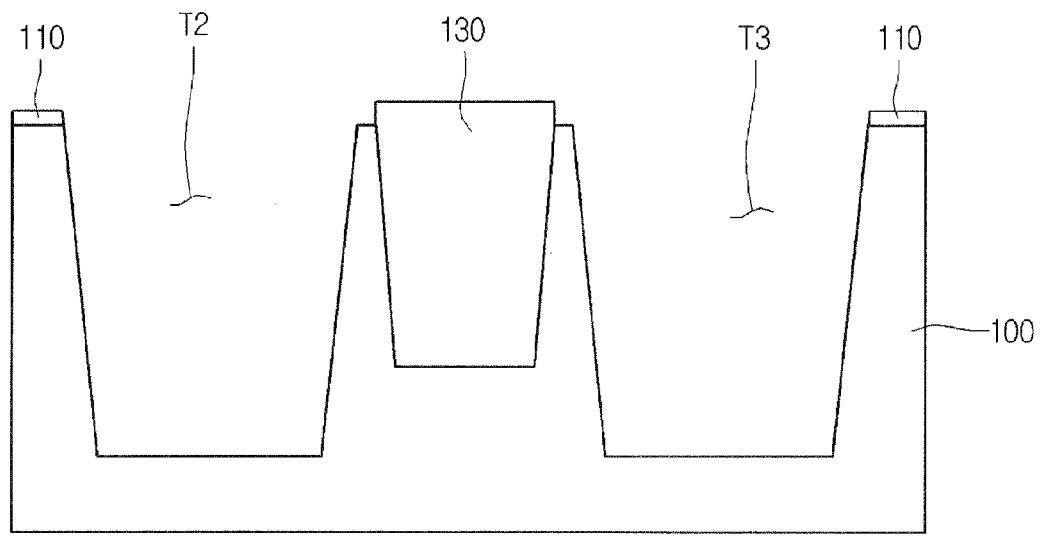

Then, referring to FIG. 7, the first oxide layer 110 and the semiconductor substrate 100 are partially etched by using the first photoresist patterns 140 as an etch mask, thereby forming second and third trenches T2 and T3 at the opposing sides of the second oxide layer 130 in the first trench.

According to one embodiment, the second and third trenches T2 and T3 are formed through a self-aligned hard mask scheme.

Sidewalls of the second and third trenches T2 and T3 may be inclined at a predetermined angle by adjusting the concentration, the injection angle and/or the amount of etching gas. Thus, the semiconductor substrate 100 may form partition walls between the first and second trenches T1 and T2 and between the first and third trenches T1 and T3.

According to the capacitor for the semiconductor device in accordance with an embodiment, silicon S1 (sec FIG. 2) remains between the first polysilicon layer 160 and the second oxide layer 130 serving as the STI layer, so that the capacitance of the capacitor can be increased.

For instance, since the silicon S1 remains between the first polysilicon layer 160 and the second oxide layer 130, the depletion width DW (see FIG. 2) may be expanded correspondingly to the horizontal width of the second oxide layer 130. As a result, if the depletion occurs, the field region is subject to the depletion; so that the value of a sub-threshold slope (S) is reduced, thereby improving the switching characteristics.

In addition, the bottom surfaces and side surfaces of the second and third trenches T2 and T3 constitute the capacitor area, so that the capacitance of the capacitor can be increased.

Further, since it is not necessary to partially remove the second oxide layer 130 to form the capacitor (e.g., there is no need to change the structure of the second oxide layer 130), the unstable isolation caused by reduction in thickness of the second oxide layer 130 can be avoided.

For example, if as in the related art, the second oxide layer 130 is partially removed to form the capacitor area in the first trench T1, the etching process must be performed several times by using a nitride layer having an etching rate lower than that of the oxide layer, and the oxide layer must be formed again because the second oxide layer 130 is removed from the sidewalls of the first trench T1 except for the bottom of the first trench T1.

In this case, the device is frequently exposed to the etching gas, on that the degradation of the device may occur.

According to embodiments, the second oxide layer 130 does not serve as the capacitor area. Rather, the second oxide layer 130 can perform the isolation function for the capacitor, on additional etching and oxide layer deposition processes may not be necessary. Thus, the unstable isolation between unit cells derived from the process parameters can be avoided, the stable capacitance can be achieved, and the degradation of the device can be minimized.

For instance, according to an embodiment, since the second oxide layer 130 serving as the STI layer remains without being recessed, the second oxide layer 130 can reliably perform the cell to cell isolation function.

Figure 8:
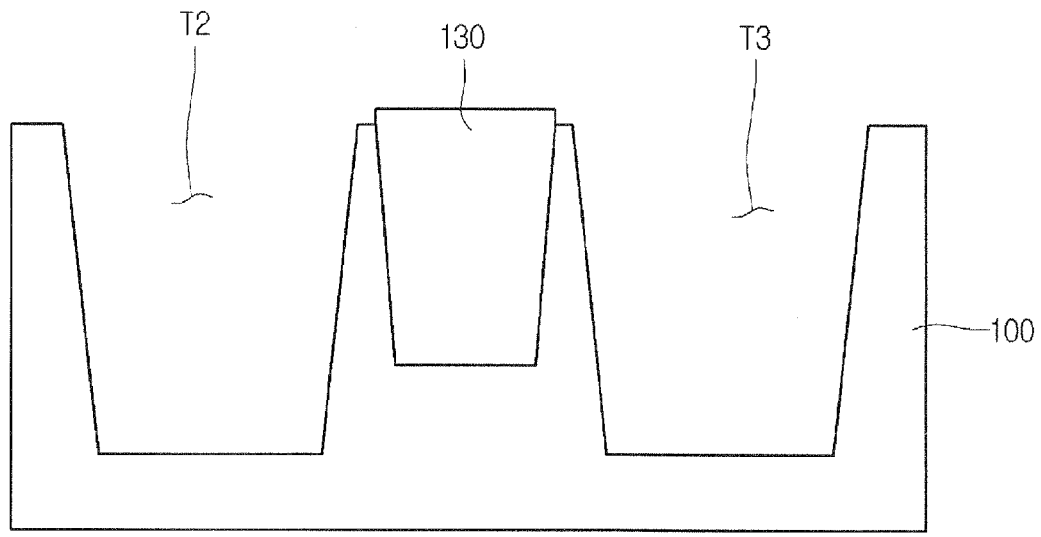

Then, referring to FIG. 8, a wet cleaning process, such as an HF cleaning process, is performed several times to clean inner surfaces of the second and third trenches T2 and T3 and to remove the first oxide layer 110 remaining on the semiconductor substrate 100.

Although not shown in the drawings, an upper portion of the second oxide layer 130 may be partially removed such that the height of the second oxide layer 130 can be adjusted.

In detail, although the second oxide layer 130 having the height higher than the surface of the semiconductor substrate 100 is shown in the drawings, the height of the second oxide layer 130 may be lower than the surface of the semiconductor substrate 100.

Figure 9A:
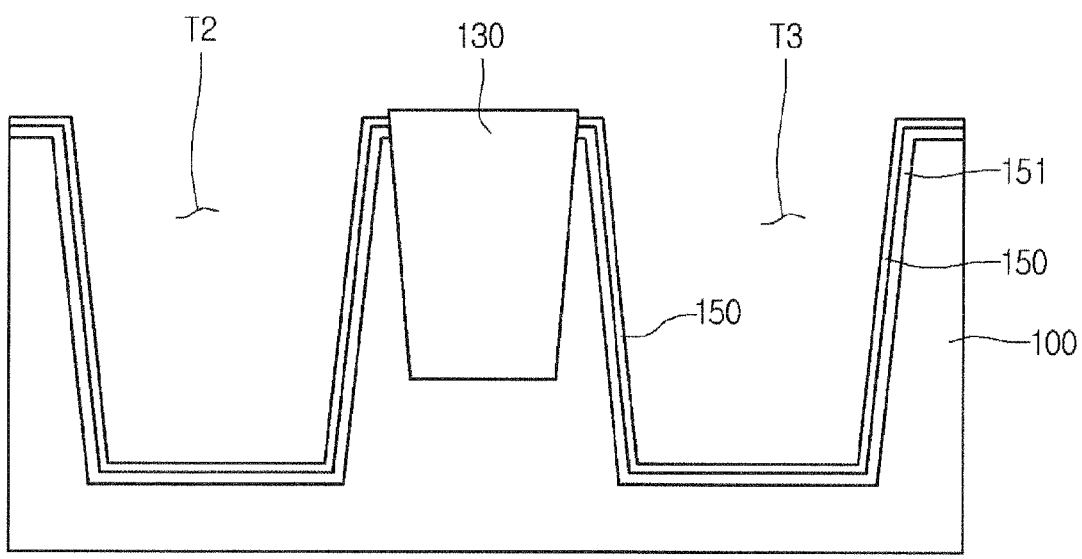

Then, referring to FIG. 9A, a third oxide layer 150 is deposited on the semiconductor substrate 100 such that the third oxide layer 150 can be formed on inner surfaces of the second and third trenches T2 and T3.

The third oxide layer 150 may include an ONO (Oxide-Nitride-Oxide) layer or a single oxide layer, but embodiments are not limited thereto.

An ion implantation layer 151 can be formed around the second and third trenches T2 and T3 by performing an ion implantation process before the third oxide layer 150 is formed.

The ion implantation layer 151 may serve as an ion diffusion region and can be formed to improve conductivity of the second and third trenches T2 and T3 serving as the capacitor area and to lower the threshold voltage.

According to an embodiment, the ion implantation layer 151 is formed in the capacitor area, so that conductivity of the second and third trenches can be improved and the threshold voltage can be lowered.

A memory cell including the capacitor for the semiconductor device in accordance with an embodiment and a transistor may be formed by combining at least one of a first substrate for LV (low voltage) devices, a second substrate for MV (mid voltage) devices and a third substrate for HV (high voltage) devices. The first, second, and third substrates are distinguished from each other according to the conductive level thereof based on the material of the substrates.

The substrates can be provided on a single semiconductor substrate by preparing particular well regions. For example, the first substrate may be prepared as an LV well through the ion implantation higher than that of the second substrate, and the second substrate may be prepared as an MV well through the ion implantation higher than that of the third substrate. The third substrate may be prepared as an HV well through the relatively low ion implantation.

If the second and third trenches T2 and T3 are formed in the first substrate, the doping concentration of ions may be increased when forming the ion implantation layer as compared with a case in which the second and third trenches T2 and T3 are formed in the second or third substrate.

In addition, if the second and third trenches T2 and T3 are formed in the second substrate, the doping concentration of ions may be increased when forming the ion implantation layer as compared with a case in which the second and third trenches T2 and T3 are formed in the third substrate.

For instance, if the capacitor for the semiconductor device in accordance with an embodiment is formed on the second substrate and the transistor 200 is formed on the first substrate, the threshold voltage of the capacitor area can be lowered because there is difference in ion implantation concentration between first and second substrates. In this case, the process for forming the ion implantation layer may be omitted.

Figure 9B:
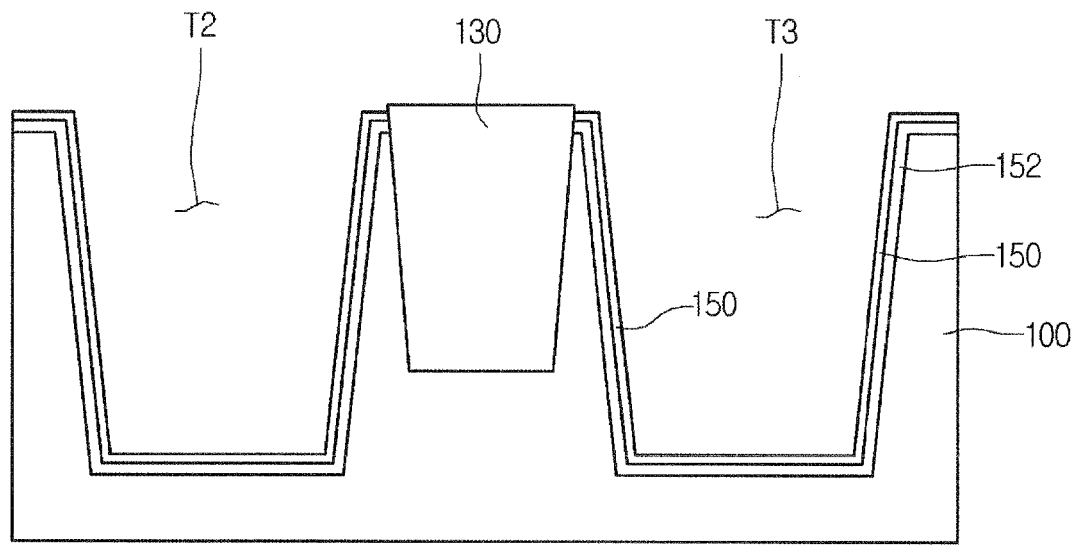
Figure 9C:
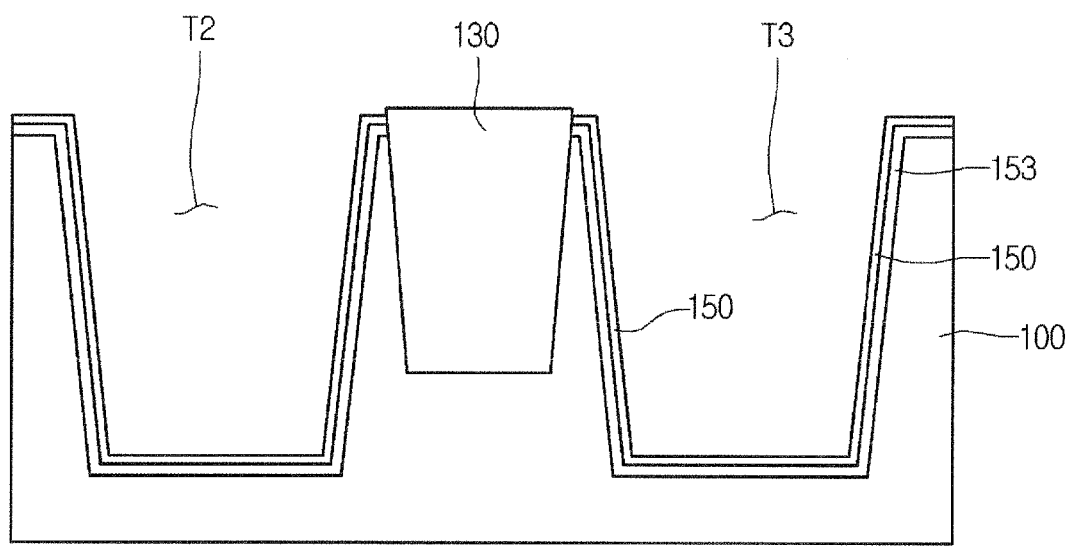

In addition, referring to FIG. 9B, an HTO layer 152 can be deposited or formed on the inner surfaces of the second and third trenches T2 and T3, and particularly on the sidewalls of the second and third trenches T2 and T3.

Or, referring to FIG. 9E, a $N_2$ doping layer 153 can be deposited or formed on the inner surfaces of the second and third trenches T2 and T3, and particularly on the sidewalls of the second and third trenches T2 and T3.

If the HTO layer 152 or the $N_2$ doping layer 153 is formed, the third oxide layer 150 can be uniformly deposited on the sidewalls and bottom walls of the second and third trenches T2 and T3, so that the stability of the capacitor characteristics can be ensured.

Figure 10:
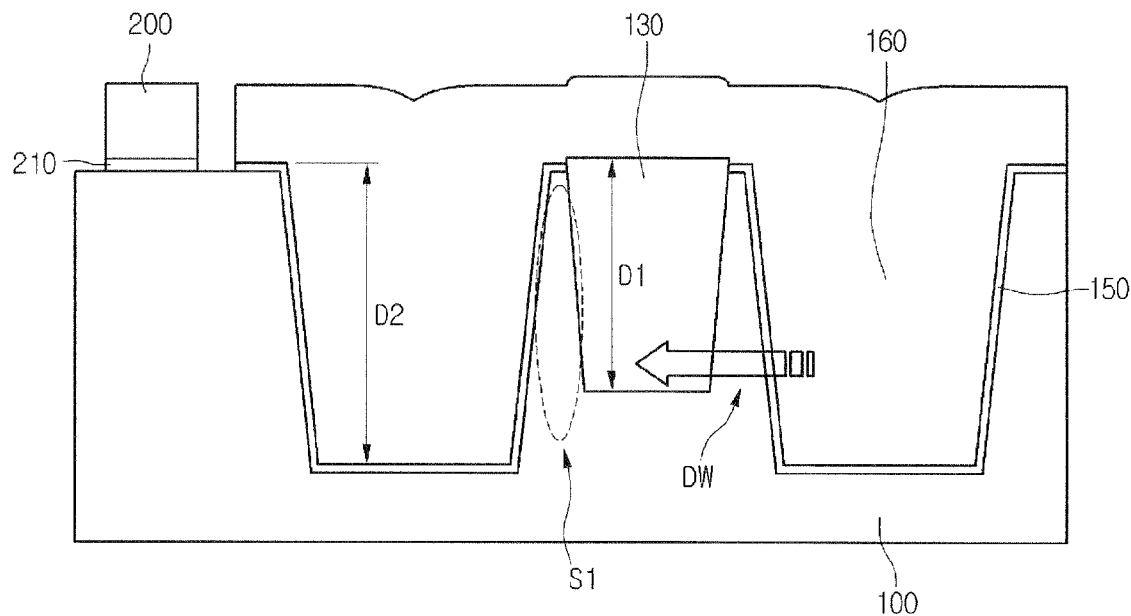

Then, referring to FIG. 10, a first polysilicon layer 160 is formed on the third oxide layer 150 such that the second and third trenches T2 and T3 can be filled with the first polysilicon layer 160.

At this time, the third oxide layer 150 and the first polysilicon layer 160 formed on the active region extending from the capacitor area having the second and third trenches T2 and T3 are patterned through the photo process and the etching process. The patterned third oxide layer 150 and the patterned first polysilicon layer 160 on the extended portion of the active region may constitute a gate insulating layer 210 and a poly gate of the transistor 200.

Therefore, the third oxide layer 150 of the capacitor may have the material and thickness the same as those of the gate insulating layer 210 of the transistor 200, and the first polysilicon layer 160 of the capacitor may have the material and thickness (which corresponds to a height from the semiconductor substrate 100) the same as that of the poly gate of the transistor 200.

The first polysilicon layer 160 can be planarized through a CMP process or an etch-back process.

According to an embodiment, the electric isolation can be ensured by the third oxide layer 130. In addition, the second trench T2 is spaced apart from the first trench T1 and the third trench T3 is spaced apart from the first trench T1 by a part of the semiconductor substrate 100, so that all surfaces of the second and third trenches T2 and T3 can be used as the capacitor area.

The second trench T2 may have a depth and a size identical to or different from that of the third trench T3. In addition, the height of the polysilicon layer 160 formed on the second trench T2 may be identical to or different from the height of the polysilicon layer 160 formed on the second trench T2.

In addition, at least one of gradients, lengths and heights of opposing sidewalls of at least one of the second and third trenches T2 and T3 may be symmetrical or asymmetrical to each other.

The capacitor for the semiconductor device in accordance with an embodiment can have the following effects.

First, the capacitor for the semiconductor device in accordance with embodiment can have increased capacitance as compared to the related art because silicon S1 remains between the first polysilicon layer 160 and the second oxide layer 130 serving as an STI (shallow trench isolation) layer.

For instance, since the silicon S1 remains between the first polysilicon layer 160 and the second oxide layer 130, the depletion width DW may be expanded corresponding to a horizontal width of the second oxide layer 130. As a result, if the depletion occurs, the field region is subject to the depletion; so that the value of the sub-threshold slope (S) is reduced, thereby improving the switching characteristics.

In addition, according to an embodiment, the second oxide layer does not serve as the capacitor area. Rather, the second oxide layer performs the isolation function for the capacitor, so additional etching and oxide layer deposition processes may not be necessary. Thus, the unstable isolation between unit cells derived from the process parameters can be avoided, the stable capacitance can be achieved, and the degradation of the device can be minimized.

For instance, according to an embodiment, since the second oxide layer serving as the STI layer remains without being recessed for filling with polysilicon, the second oxide layer can reliably perform the cell to cell isolation function.

In addition, according to an embodiment, the capacitance of the capacitor can be maximized while increasing the integration degree of the capacitor by employing the triple trench structure.

Further, according to an embodiment, the trenches, which determine the capacitance of the capacitor, can be isolated from each other by the partition wall structure of the semiconductor substrate, so the capacitor area can be maximized.

In addition, according to an embodiment, an ion implantation layer (not shown) can be formed in the capacitor area, so that conductivity of the second and third trenches can be improved and the threshold voltage can be lowered.

In addition, according to an embodiment, the third oxide layer can be uniformly deposited on sidewalls and bottom walls of the second and third trenches by using a HTO layer (not shown) or $N_2$ doping layer (not shown) on the sidewalls of the second and third trenches before depositing the third oxide layer. Thus, stability of the capacitor characteristics can be further ensured.

Embodiment 2

Figure 11:
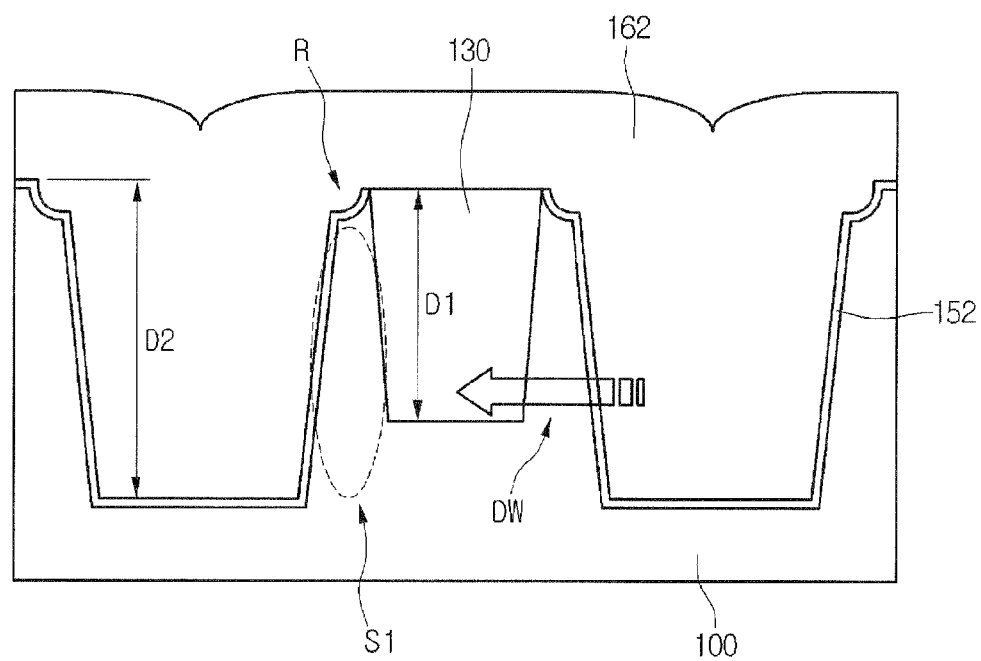
FIG. 11 is a cross-sectional view showing a capacitor for a semiconductor device according to a second embodiment.

FIG. 11 is a cross-sectional view showing a capacitor for a semiconductor device according to a second embodiment.

The capacitor for a semiconductor device according to the second embodiment includes a second oxide layer 130 formed on a semiconductor substrate 100, a sixth oxide layer 152 formed on the semiconductor substrate 100 as well as in fourth and fifth trenches formed in the active region at opposing sides of the second oxide layer 130, and a second polysilicon layer 162 formed on the sixth oxide layer 152 such that the fourth and fifth trenches are filled with the second polysilicon layer 162.

According to the second embodiment, different from the first embodiment, an upper portion of a lateral side of the second polysilicon layer 162 has a rounded extension.

Thus, according to the second embodiment, since the upper portion of the lateral side of the second polysilicon layer 162 has a rounded extension, the trench depth can be easily adjusted, the capacitance of the capacitor can be increased and the field focusing can be attenuated.

If the second polysilicon layer 162 is not rounded at a top corner, the field focusing may occur at a sharp edge of the second polysilicon layer 162 due to the lightning rod effect, so that leakage current is increased and the breakdown voltage is reduced, thereby exerting influence upon TDDB (Time Dependent Dielectric Breakdown).

In addition, the second embodiment may adopt the technical features and effects of the first embodiment.

For instance, the capacitor for the semiconductor device according to the second embodiment can have increased capacitance because silicon S1 remains between the second polysilicon layer 162 and the second oxide layer 130 serving as the STI layer.

Thus, because the silicon S1 remains between the second polysilicon layer 162 and the second oxide layer 130, the depletion width DW may be expanded corresponding to a horizontal width of the second oxide layer 130. As a result, if the depletion occurs, the field region is subject to the depletion; so that the value of a sub-threshold slope (S) is reduced, thereby improving the switching characteristics.

In addition, according to the second embodiment, since the second oxide layer serving as the STI layer remains without being recessed, the second oxide layer can reliably perform the cell to cell isolation function.

According to the second embodiment, the depth D1 of the second oxide layer 130 serving as the STI layer is at least ⅓ the depth D2 of the second polysilicon layer 162, but embodiments are not limited thereto. Therefore, the second oxide layer 130 may serve as a hard mask when the trench etching process is performed while stably performing the cell to cell isolation.

In addition, according to the second embodiment, the capacitance of the capacitor can be maximized while increasing the integration degree of the capacitor by employing the triple trench structure.

Further, according to the second embodiment, the trenches, which determine the capacitance of the capacitor, can be isolated from each other by the partition wall structure of the semiconductor substrate, so the capacitor area can be maximized.

In addition, according to the second embodiment, an ion implantation layer (not shown) can be formed in the capacitor area, so that conductivity of the fifth and sixth trenches can be improved and the threshold voltage can be lowered.

Further, according to the second embodiment, the third oxide layer can be uniformly deposited on sidewalls and bottom walls of the fifth and sixth trenches by incorporating an HTO layer or an $N_2$ doping layer (not shown) before forming the third oxide layer. Thus, stability of the capacitor characteristics can be further ensured.

Hereinafter, the method of manufacturing a capacitor for the semiconductor device according to the second embodiment will be described with reference to FIGS. 12 to 23.

Figure 12:
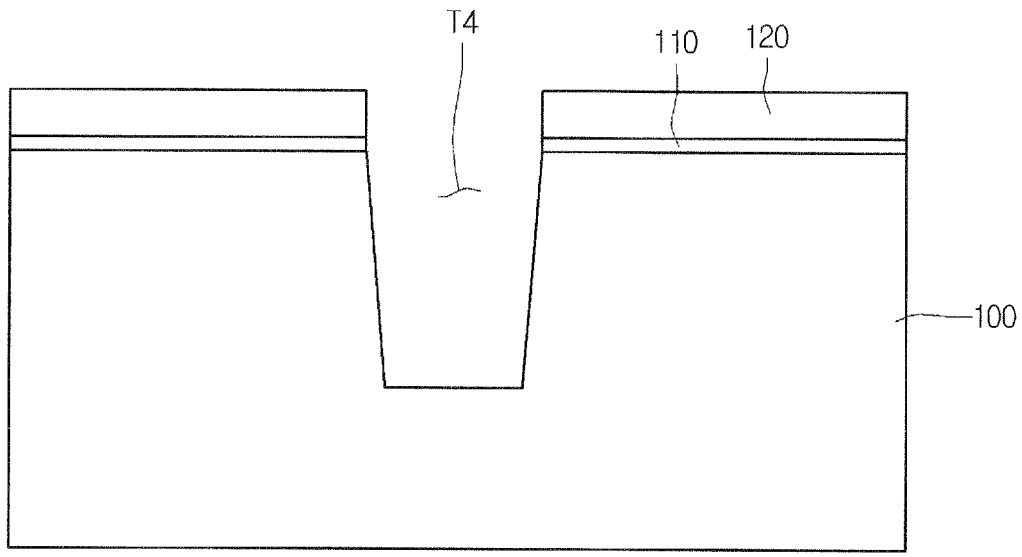
FIGS. 12 to 23 are cross-sectional views showing a procedure for manufacturing a capacitor for a semiconductor device according to the second embodiment.

First, referring to FIG. 12, a first oxide layer 110 is formed on the semiconductor substrate 100, a first nitride layer 120 is formed on the first oxide layer 110, and a fourth trench T4 is formed.

Figure 13:
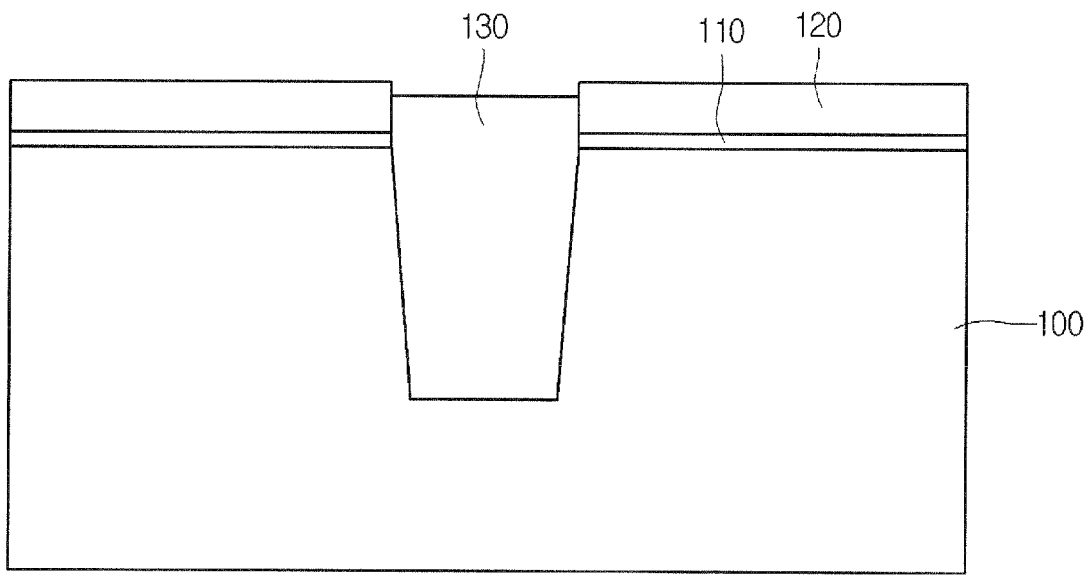
Figure 14:
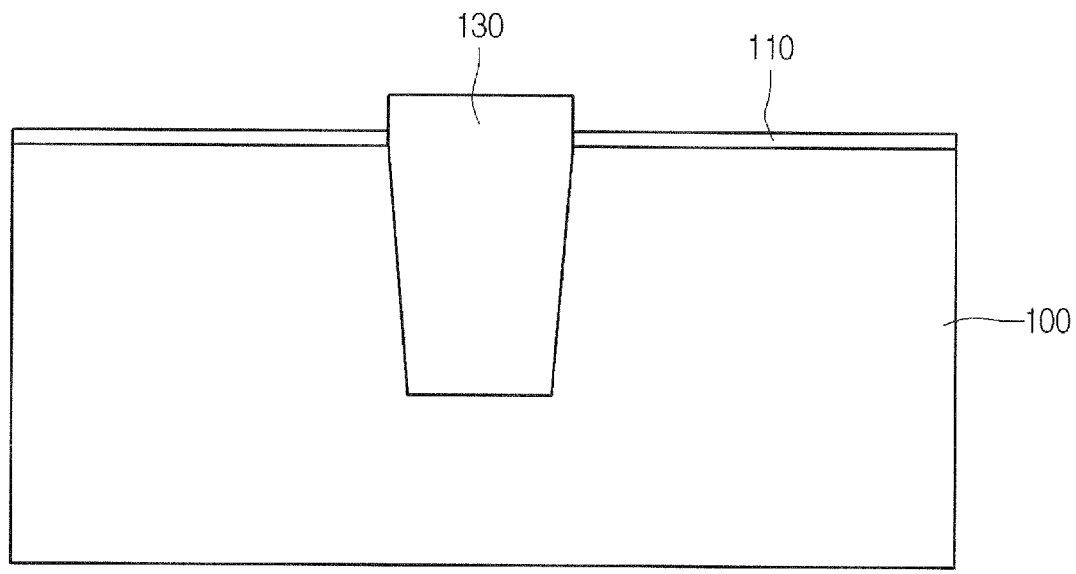

Then, referring to FIG. 13, a second oxide layer 130 is formed on the first nitride layer 120 such that the fourth trench T4 is filled with the second oxide layer 130, and the second oxide layer 130 is planarized such that the surface of the first nitride layer 120 is exposed. Then, referring to FIG. 14, the first nitride layer 120 is removed. The processes shown in FIGS. 12 to 14 may adopt the technical features of the first embodiment.

Figure 15:
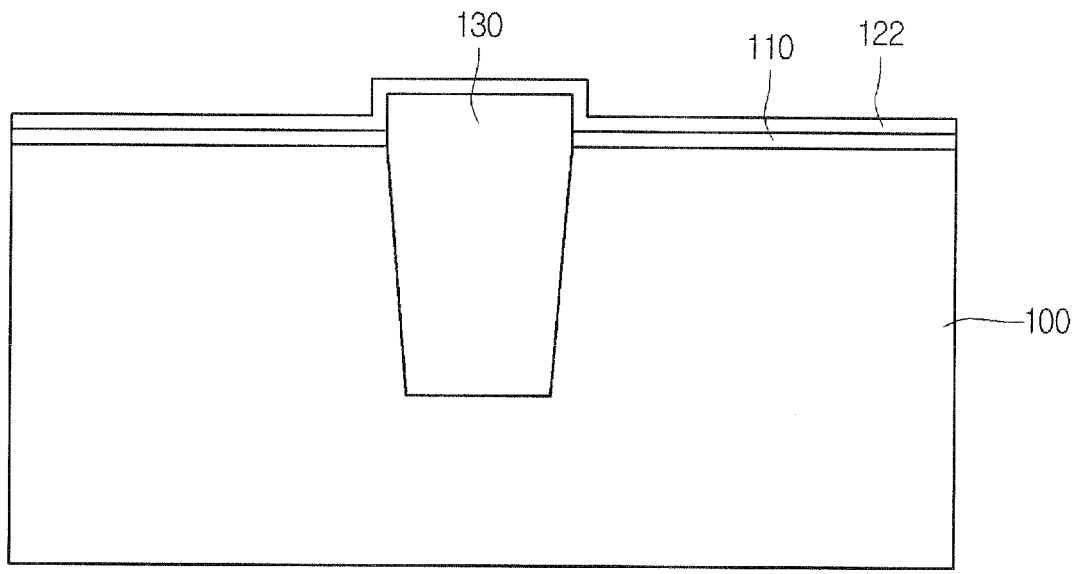
Figure 16:
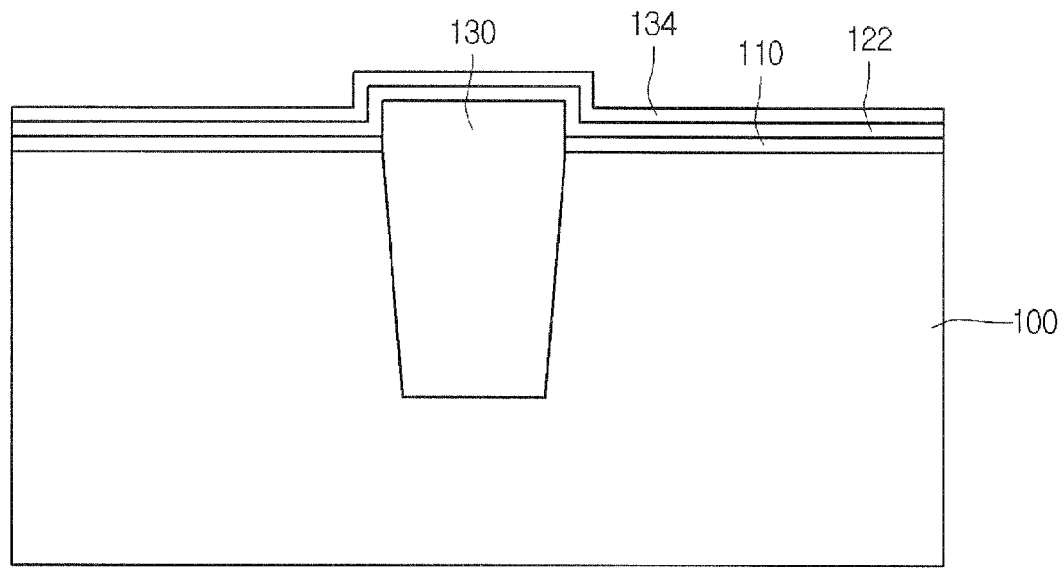

Next, referring to FIG. 15, after the first nitride layer 120 has been removed, a second nitride layer 122 is deposited on the semiconductor substrate 100. Then, referring to FIG. 16, a fourth oxide layer 134 is deposited on the second nitride layer 122. The fourth oxide layer 134 can be sued as a hard mask in the subsequent processes.

The fourth oxide layer 134 may have a thickness four times thicker than a thickness of the second nitride layer 122, but embodiments are not limited thereto.

According to the second embodiment, the second nitride layer 122 and the fourth oxide layer 134 may be employed as a self-aligned hard mask, so that field loss can be inhibited from occurring in the logic region and capacitor region and the process can be simplified.

The second nitride layer 122 may include a silicon nitride layer and the fourth oxide layer 134 may include THOS, but embodiments are not limited thereto.

Figure 17:
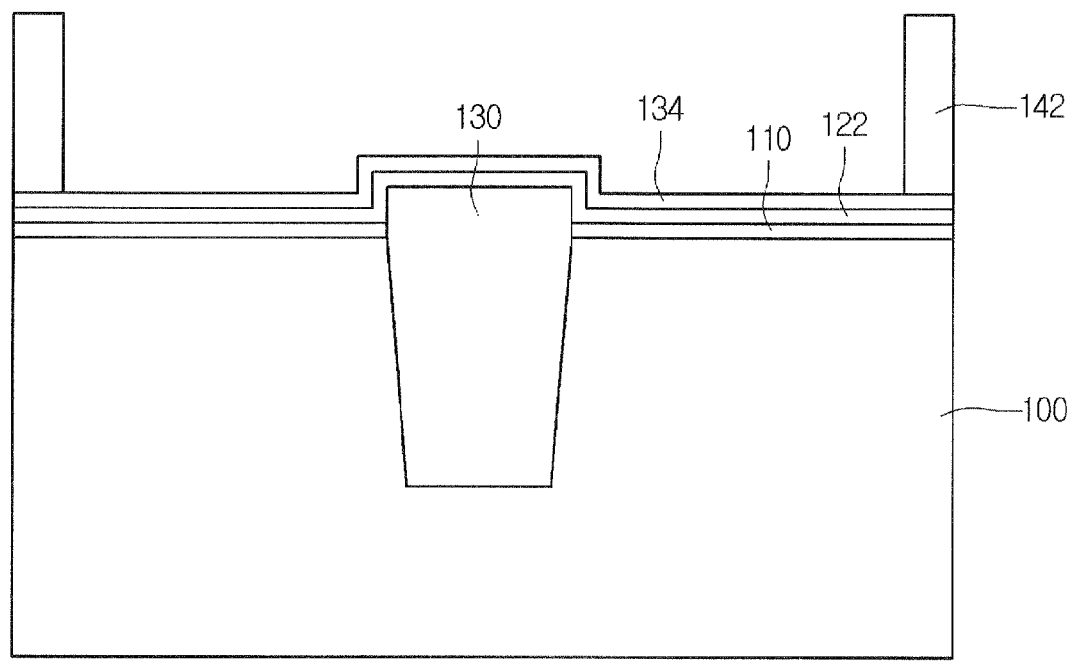

Then, referring to FIG. 17, second photoresist patterns 142, which define a capacitor area of the memory cell, are formed on the semiconductor substrate 100.

Figure 18:
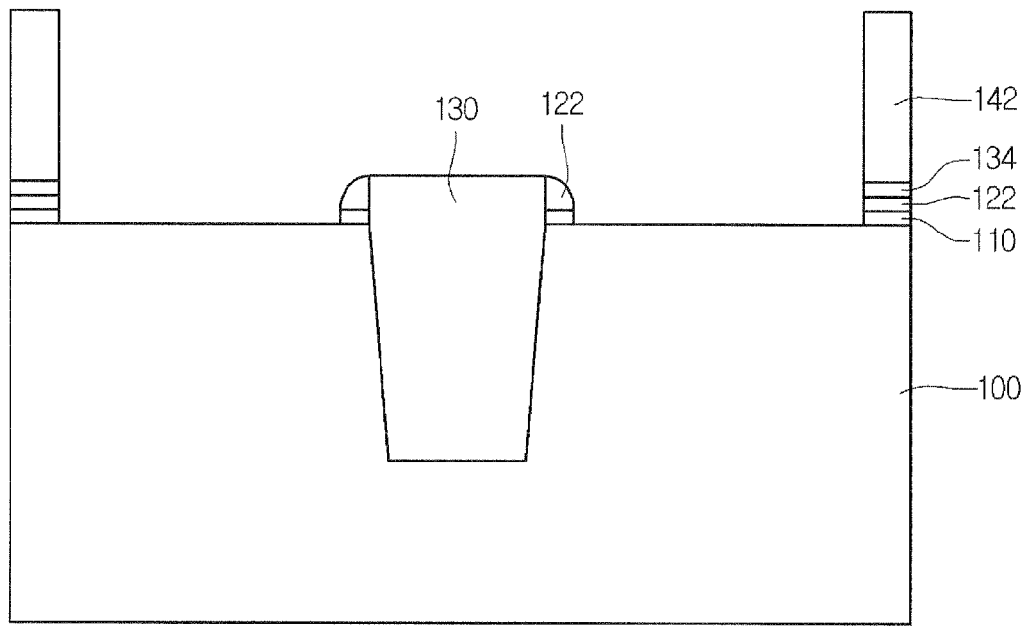

After that, referring to FIG. 18, the hard mask, that is, the fourth oxide layer 134 and the second insulating layer 122 are partially removed by using the second photoresist patterns 142 as a mask, thereby exposing the semiconductor substrate 100 in the capacitor region.

At this time, the second insulating layer 122 and the first oxide layer 110 may partially remain on the sidewalls of a portion of the second oxide layer 130 extending above the surface of the semiconductor substrate 100.

Figure 19:
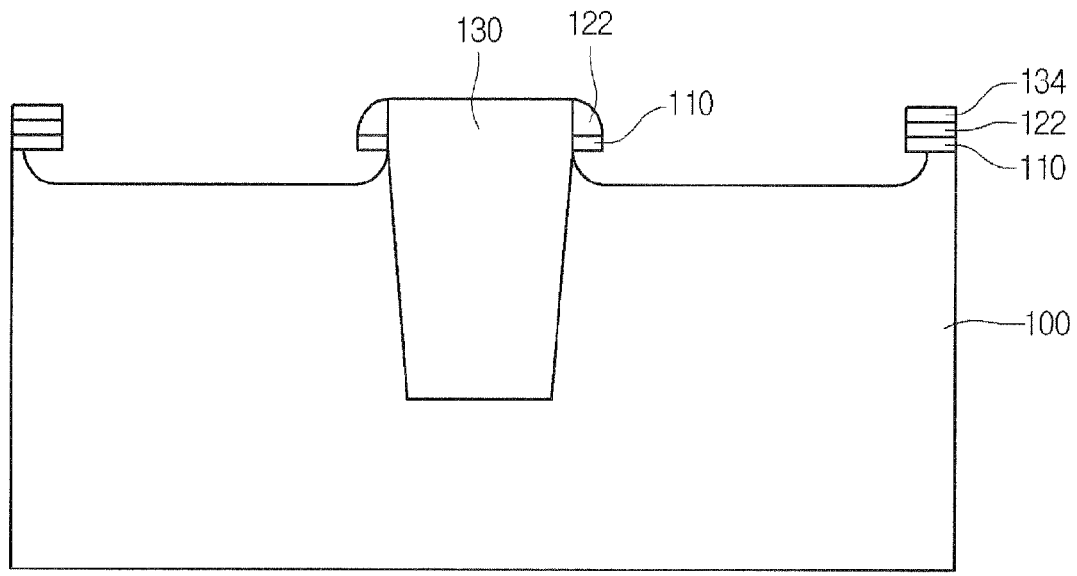

After that, referring to FIG. 19, the second photoresist patterns 142 are removed and a CDE (chemical dry etching) process is performed by using the remaining fourth oxide layer 134 and second insulating layer 122 as the hard mask.

For instance, the semiconductor substrate 100 may be isotropically etched by a thickness of about 1000-1500 Å using the remaining fourth oxide layer 134 and second insulating layer 122 as a hard mask, but embodiments are not limited thereto.

According to an embodiment, if the CDE process is performed by using the hard mask, the silicon substrate may have no sharp profile at the boundary region between the silicon substrate and the second oxide layer 130 serving as field oxide. Otherwise, the silicon substrate may have the sharp profile due to the etching selectivity between the silicon substrate and the second oxide layer 130.

Thus, according to the second embodiment, the upper portion of the lateral side of the second polysilicon layer 162 is rounded (i.e., has a rounded extension).

Since the upper portion of the lateral side of the second polysilicon layer 162 has a rounded extension, the trench depth can be easily adjusted, the capacitance of the capacitor can be increased and the field focusing can be attenuated.

If the second polysilicon layer 162 does not have a rounded edge, the field focusing may occur at the sharp edge of the second polysilicon layer 162 due to the lightning rod effect, so that leakage current is increased and the breakdown voltage is reduced, thereby exerting influence upon TDDB (Time Dependent Dielectric Breakdown).

Figure 20:
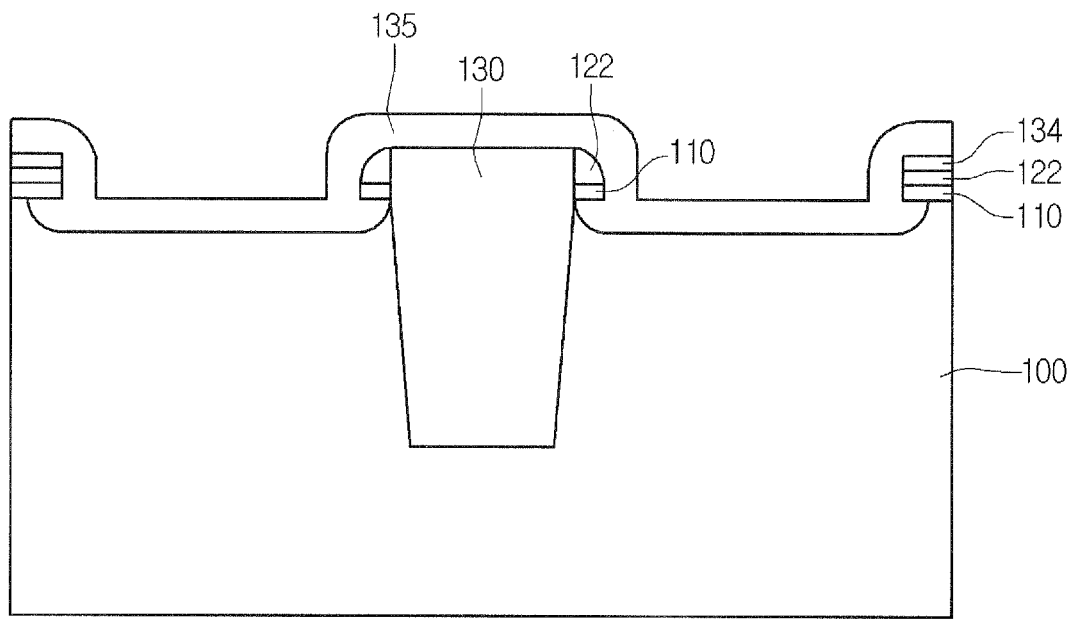
Figure 21:
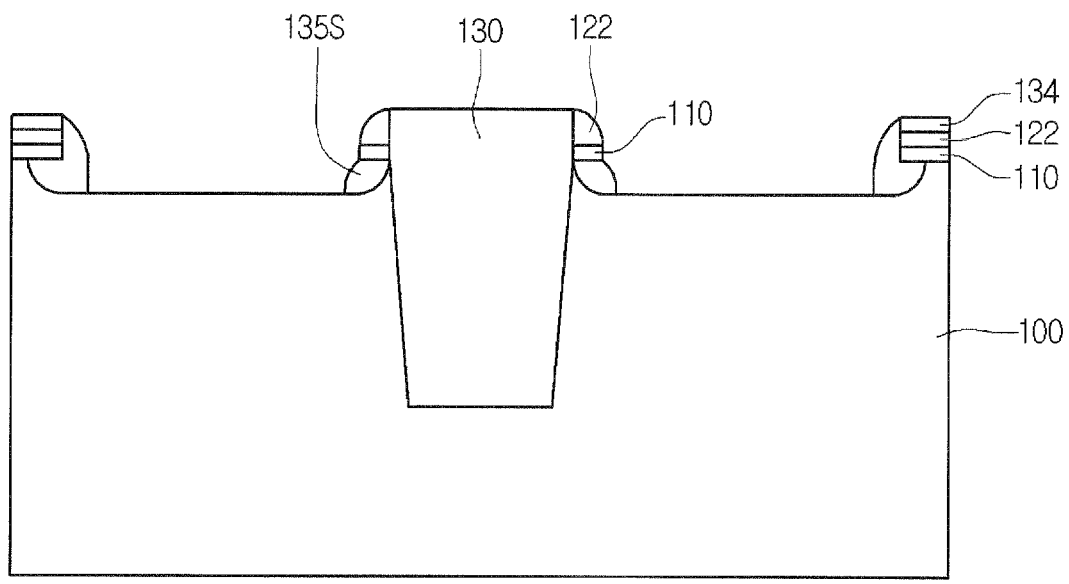

Then, referring to FIG. 20, a fifth oxide layer 135 is formed on the entire surface of the semiconductor substrate 100 and the blanket etching is performed with respect to the fifth oxide layer 135 to form a spacer fifth oxide layer 135S referring to FIG. 21. The fifth oxide layer 135 can include TEOS, but embodiments are not limited thereto.

Figure 22:
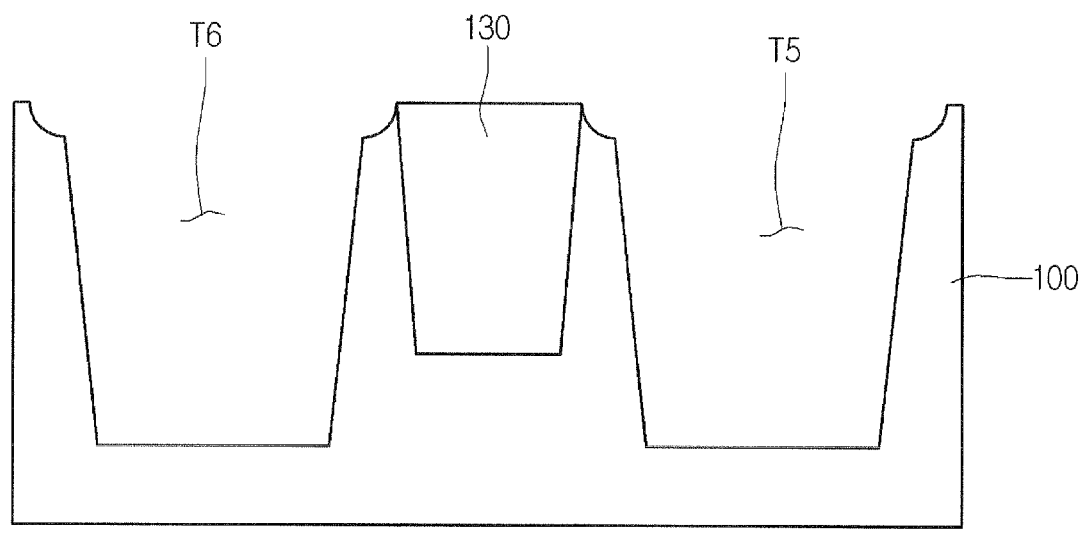

Next, referring to FIG. 22, the exposed semiconductor substrate 100 is etched by using the spacer fifth oxide layer 135S, the fourth oxide layer 134 and the second insulating layer 122 as the hard mask, thereby forming the fifth and sixth trenches T5 and T6.

According to an embodiment, the fifth and sixth trenches T5 and T6 may be formed through a self-aligned hard mask scheme. Then, the spacer fifth oxide layer 135S, the fourth oxide layer 134 and the second insulating layer 122 used as the hard mask are removed through a wet etching process.

As described above, the second insulating layer 122 and the fourth oxide layer 134 can be used as the hard mask to form the fifth and sixth trenches T5 and T6, so the field loss can be inhibited from occurring in the logic region and the capacitor region.

According to an embodiment, the silicon substrate is etched without etching the field oxide and the sidewalls and the bottom wall of the etched silicon substrate may be used as the capacitor area, so that the capacitor area may be increased proportionally to the depth of the silicon substrate, so that the capacitance of the capacitor can be easily adjusted.

According to the capacitor for the semiconductor device in accordance with an embodiment, silicon S2 remains between the second polysilicon layer 162 and the second oxide layer 130 serving as the STI layer, so that the capacitance of the capacitor can be increased.

In addition, according to the embodiment, it is not necessary to remove the field oxide, so the device isolation caused by reduction of the field oxide thickness may not occur.

Therefore, according to an embodiment, since the second oxide layer serving as the STI layer remains without being recessed, the second oxide layer can reliably perform the cell to cell isolation function.

Meanwhile, referring to FIG. 22, a wet cleaning process can be performed after removing the spacer fifth oxide layer 135S, the forth oxide layer 134 and the second insulating layer 122. For instance, the 11F cleaning process is performed several times to clean inner surfaces of the fifth and sixth trenches T5 and T6 and to remove the first oxide layer 110 remaining on a part of the semiconductor substrate 100.

Figure 23:
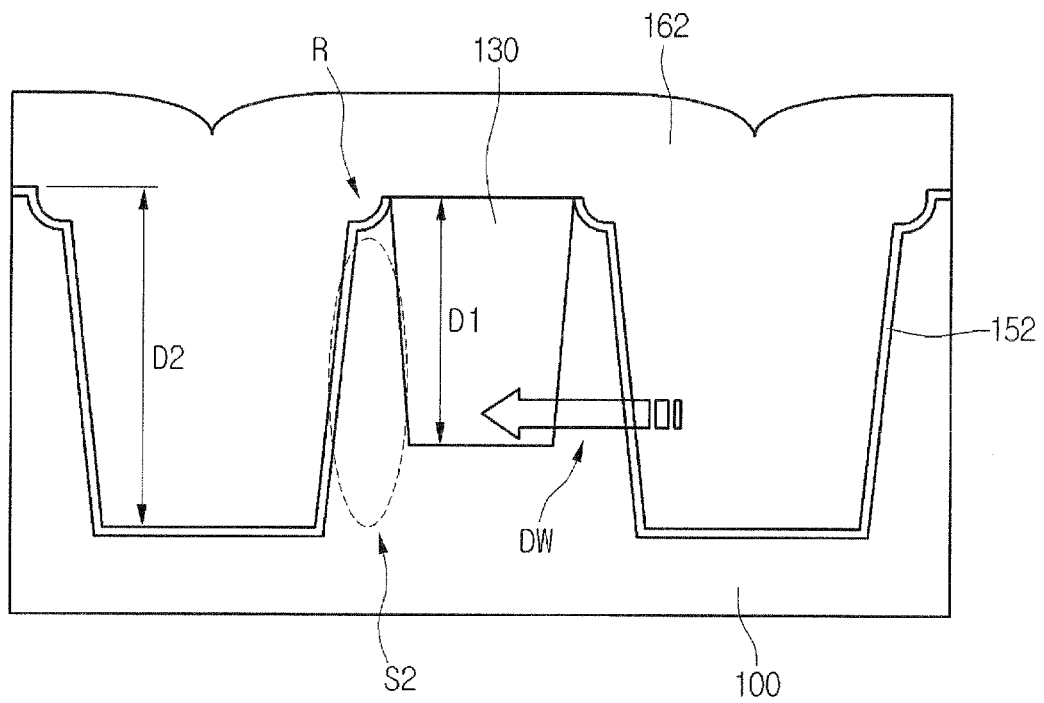

Then, referring to FIG. 23, a sixth oxide layer 152 is formed on the semiconductor substrate 100 such that the sixth oxide layer 152 can be formed on the inner surfaces of the fifth and sixth trenches T5 and T6.

The sixth oxide layer 152 may include an ONO (Oxide-Nitride-Oxide) layer or a single oxide layer, but embodiments are not limited thereto.

An ion implantation layer (not shown) can be formed around the fifth and sixth trenches T5 and T6 by performing the ion implantation process before the sixth oxide layer 152 is formed.

According to an embodiment, an ion implantation layer is formed in the capacitor area, so that conductivity of the fifth and sixth trenches can be improved and the threshold voltage can be lowered.

In addition, an HTO layer or a $N_2$ doping layer can be deposited or formed on the inner surfaces of the fifth and sixth trenches T5 and T6, particularly on the sidewalls of the fifth and sixth trenches T5 and T6 before forming the sixth oxide layer 152.

Then, a second polysilicon layer 162 is formed on the sixth oxide layer 152 such that the fifth and sixth trenches T5 and T6 can be filled with the second polysilicon layer 162.

At this time, the sixth oxide layer 152 and the second polysilicon layer 162 formed on the active region extending from the capacitor area are patterned through the photo process and the etching process. The patterned sixth oxide layer 152 and the patterned second polysilicon layer 162 may constitute a gate insulating layer 210 and a poly gate of the transistor 200.

Therefore, the sixth oxide layer 152 of the capacitor may have the material and thickness the same as that of the gate insulating layer 210 of the transistor 200, and the second polysilicon layer 162 of the capacitor may have the material and thickness (which corresponds to a height from the semiconductor substrate 100) the same as those of the poly gate of the transistor 200.

The second polysilicon layer 162 can be planarized through a CMP process or an etch-back process.

Figure 24:
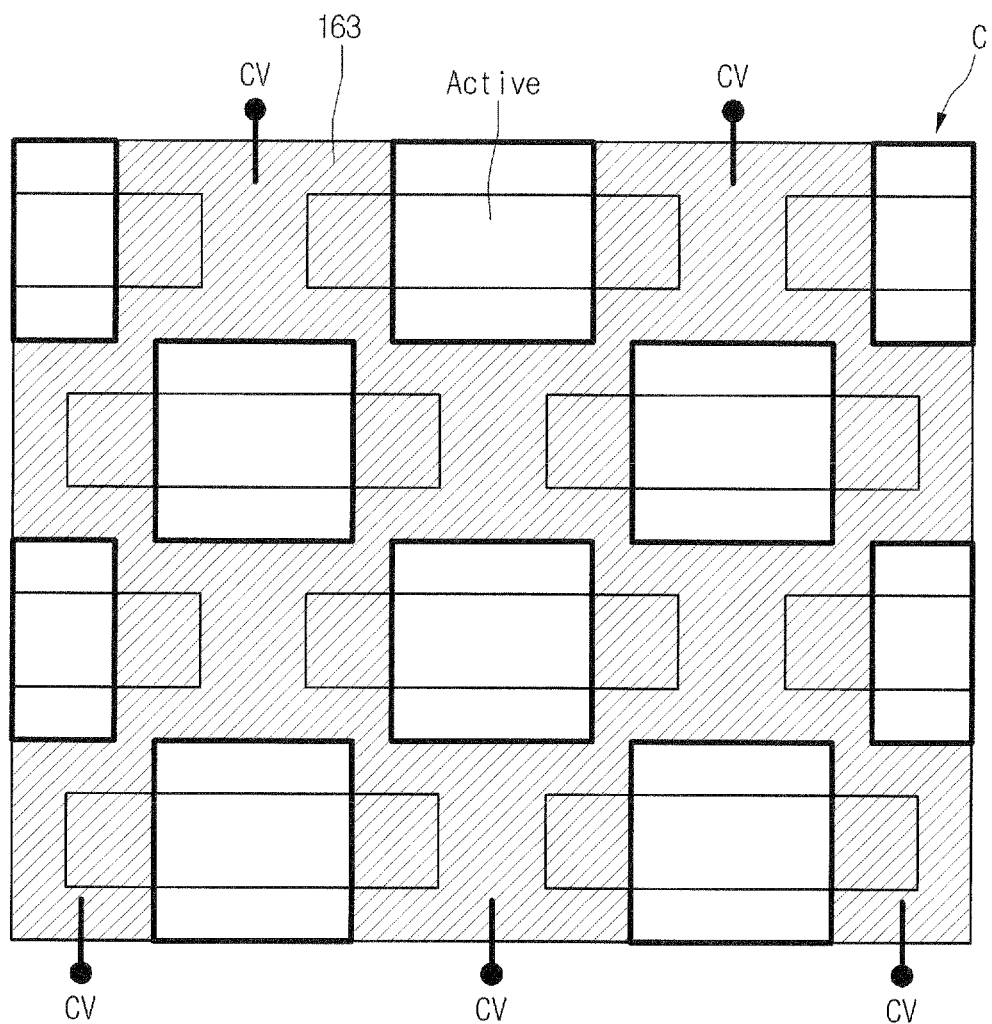
FIG. 24 is a plan view showing a capacitor for a semiconductor device according to the second embodiment.

FIG. 24 is a plan view showing a capacitor arrangement for a semiconductor device according to an embodiment.

An active region ACTIVE of the capacitor for the semiconductor device in accordance with an embodiment extends from a capacitor region C, and a transistor (not shown) is formed on the extended portion of the active region ACTIVE.

According to one embodiment, a gate poly 163 of the capacitor is electrically connected in the form of a mesh. Thus, the gate poly 163 of the capacitor can be constantly kept with the same capacitor voltage CV. In addition, since the gate poly 163 is prepared in the form of the mesh, the voltage can be stably supplied.

The capacitor for the semiconductor device in accordance with an embodiment can have the following effects.

According to the second embodiment, different from the first embodiment, the upper portion of the lateral side of the second polysilicon layer 162 is rounded.

Thus, according to the second embodiment, since the upper portion of the lateral side of the second polysilicon layer 162 is rounded, the trench depth can be easily adjusted, the capacitance of the capacitor can be increased and the field focusing can be attenuated.

In addition, the second embodiment may adopt the technical features and effects of the first embodiment. For instance, the capacitor for the semiconductor device according to the second embodiment can increase capacitance because silicon S1 remains between the second polysilicon layer 162 and the second oxide layer 130 serving as the ST1 layer.

Thus, as the silicon S1 remains between the second polysilicon layer 162 and the second oxide layer 130, the depletion width DW may be expanded corresponding to a horizontal width of the second oxide layer 130. As a result, if the depletion occurs, the field region is subject to the depletion; so that the value of a sub-threshold slope (S) is reduced, thereby improving the switching characteristics.

In addition, according to the second embodiment, since the second oxide layer serving as the STI layer remains without being recessed, the second oxide layer can reliably perform the cell to cell isolation function.

In addition, according to the second embodiment, the capacitance of the capacitor can be maximized while increasing the integration degree of the capacitor by employing the triple trench structure.

Further, according to the second embodiment, the trenches, which determine the capacitance of the capacitor, can be isolated from each other by the partition wall structure of the semiconductor substrate, so the capacitor area can be maximized.

In addition, according to the second embodiment, an ion implantation layer (not shown) can be formed in the capacitor area, so that conductivity of the fifth and sixth trenches can be improved and the threshold voltage can be lowered.

Further, according to the second embodiment, the third oxide layer can be uniformly deposited on sidewalls and bottom walls of the fourth and fifth trenches due to the addition of an HTO layer or an $N_2$ doping layer (not shown). Thus, stability of the capacitor characteristics can be further ensured.

In addition, according to the second embodiment, the second polysilicon layer 162 serving as the gate poly of the capacitor can he electrically connected in the form of the mesh. Thus, the gate poly 163 of the capacitor can be constantly kept with the same capacitor voltage CV. In addition, since the gate poly 163 is prepared in the form of the mesh, the voltage can be stably supplied.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A capacitor for a semiconductor device, the capacitor comprising;
   a second oxide layer filling a first trench in a semiconductor substrate;
   a second trench and a third trench in an active region at opposing sides of the second oxide layer in the first trench;
   a third oxide layer on the semiconductor substrate and on inner surfaces of the second and third trenches;
   an HTO (High Temperature Oxide) layer or an $N_2$ doping layer between the third oxide layer and the semiconductor substrate; and
   a polysilicon layer on the third oxide layer and filling the second and third trenches;
   wherein the second and the third trenches are fully enclosed by the semiconductor substrate which comprises only one type of dopant ion.

2. The capacitor of claim 1, wherein partition walls formed by the semiconductor substrate are provided between the first and second trenches and between first and third trenches.

3. The capacitor of claim 1, wherein a part of the semiconductor substrate remains between the polysilicon layer filling the second and third trenches and the second oxide layer.

4. The capacitor of claim 1, wherein a part of the semiconductor substrate is concavely rounded at a region corresponding to upper portions of the second and third trenches.

5. The capacitor of claim 1, wherein an upper portion of a lateral side of the polysilicon layer filling the second and third trenches has a rounded extension.

6. The capacitor of claim 1, wherein a depth of the second oxide layer in the semiconductor substrate is at least ⅓ a depth of the polysilicon layer filling the second and third trenches.

7. The capacitor of claim 1, further comprising an ion implantation layer between the third oxide layer and the semiconductor substrate.

8. The capacitor of claim 1, wherein the polysilicon layer is prepared in a form of a mesh and electrically connects to a plurality of active regions.

9. The capacitor of claim 1, further comprising a gate insulating layer and a gate of a transistor on a portion of the active region extending from a capacitor area having the second and third trenches, wherein the gate insulating layer is formed from patterning the third oxide layer and the gate is formed from patterning the polysilicon layer.

10. A method of manufacturing a capacitor for a semiconductor device, the method comprising:
    forming a first trench in a semiconductor substrate and forming a second oxide layer in the first trench;
    forming second and third trenches in an active region at opposing sides of the second oxide layer in the first trench;
    forming a third oxide layer on the semiconductor substrate and on inner surfaces of the second and third trenches;
    forming a polysilicon layer on the third oxide layer such that the second and third trenches are filled with the polysilicon layer;
    wherein the second and the third trenches are fully enclosed by the semiconductor substrate which comprises only one type of dopant ion;
    wherein the forming of the second oxide layer in the first trench comprises:
    forming a first oxide layer on the semiconductor substrate;
    forming a first nitride layer on the first oxide layer;
    forming the first trench by partially removing the first oxide layer, the first nitride layer, and the semiconductor substrate;
    forming the second oxide layer on the first nitride layer such that the first trench is filled with the second oxide layer;
    planarizing the second oxide layer until the first nitride layer is exposed;
    removing the first nitride layer, thereby forming the second oxide layer in the first trench;
    forming a second nitride layer on the second oxide layer after the first nitride layer is removed; and
    forming a fourth oxide layer on the second nitride layer.

11. The method of claim 10, wherein the forming of the second and third trenches comprises using the second nitride layer and the fourth oxide layer as a self-aligned hard mask.

12. The method of claim 11, further comprising concavely rounding an upper portion of the semiconductor substrate before the second and third trenches are formed.

13. The method of claim 12, wherein the concavely rounding of the upper portion of the semiconductor substrate comprises:
    forming a fifth oxide layer on the semiconductor substrate;
    forming a spacer fifth oxide layer by blanket etching the fifth oxide layer; and
    rounding the upper portion of the semiconductor substrate by performing a chemical dry etching (CDE) with respect to the exposed semiconductor substrate by using the spacer fifth oxide layer, the second nitride layer and the fourth oxide layer as a hard mask.

14. The method of claim 10, wherein sidewalls of the second and third trenches are inclined at a predetermined angle, and partition walls formed by the semiconductor substrate are provided between the first and second trenches and between first and third trenches.

15. The method of claim 10, further comprising forming an ion implantation layer around the second and third trenches before forming the third oxide layer.

16. The method of claim 10, further comprising patterning the third oxide layer and the polysilicon layer on a portion of the active region extending from a capacitor area having the second and third trenches to form a gate insulating layer from the third oxide layer and a gate of a transistor from the polysilicon layer.

* * * * *